United States Patent [19]

Akai

[11] Patent Number: 4,478,675
[45] Date of Patent: Oct. 23, 1984

[54] METHOD OF PRODUCING GaAs SINGLE CRYSTALS DOPED WITH BORON

[75] Inventor: Shin-ichi Akai, Itami, Japan

[73] Assignee: Sumitomo Electric Industries, Inc., Osaka, Japan

[21] Appl. No.: 418,174

[22] Filed: Sep. 14, 1982

[30] Foreign Application Priority Data

Sep. 18, 1981 [JP] Japan .................. 56-148335

[51] Int. Cl.$^3$ ............................. C30B 15/04
[52] U.S. Cl. ..................... 156/605; 156/607; 156/DIG. 83
[58] Field of Search ............ 156/605, 607, 616 A, 156/617 SP, 619, DIG. 70, DIG. 83, DIG. 86, DIG. 89; 252/623.6 A

[56] References Cited

U.S. PATENT DOCUMENTS

| | | | |
|---|---|---|---|
| 2,861,905 | 11/1958 | Indig et al. | 156/605 |
| 3,533,967 | 10/1970 | McNeely et al. | 156/605 |
| 3,630,906 | 12/1971 | Willardson et al. | 156/605 |
| 3,725,284 | 4/1973 | Touchy | 156/616 A |
| 3,741,817 | 6/1973 | Bienert et al. | 156/605 |
| 4,299,650 | 11/1981 | Bonner | 156/617 SP |
| 4,303,464 | 12/1981 | Suzuki et al. | 156/605 |

FOREIGN PATENT DOCUMENTS

| | | | |
|---|---|---|---|
| 2133875 | 1/1973 | Fed. Rep. of Germany | 156/607 |
| 104796 | 8/1981 | Japan | 156/605 |
| 104797 | 8/1981 | Japan | 156/605 |

OTHER PUBLICATIONS

S. E. Blum et al., Growth of Low Strain GaP by Liquid-Encapsulation, Vertical-Gradient Freeze Technique, Nov. 1972, pp. 588–589.
M. E. Weiner et al., Liquid Encapsulated Czochralski Growth of GaAs, J. Electrochem., Soc. (U.S.A.), vol. 118, No. 2 (Feb. 1971), pp. 301–306.
Conference Proceedings of the IISCG2 Spring School on Crystal Growth and Characterization, Mar. 31–Apr. 7, 1974, pp. 75–87.
T. R. AuCoin et al., Liquid Encapsulated Compounding and Czochralski Growth of Semi-Insulating Gallium Arsenide, Solid State Technology, Jan. 1979, pp. 59–62.

Primary Examiner—David Lacey
Attorney, Agent, or Firm—Wenderoth, Lind & Ponack

[57] ABSTRACT

GaAs single crystals doped with boron and having a lowered dislocation density are grown from a GaAs melt covered with $B_2O_3$ melt as a liquid encapsulant. The method comprises using a crucible made of a material selected from the group consisting of PBN, AlN and $Al_2O_3$ as a crucible for holding the GaAs melt, adding 0.25 to 0.95 atomic percent of boron to the GaAs melt under conditions such that the residual oxygen quantity is at most $5 \times 10^{-2}$ mole percent to the GaAs melt, and thereby adjusting the concentration of boron in the grown crystal to $2 \times 10^{18}$ to $1 \times 10^{19}$ atoms per cm$^3$. The method is applied to an LE-VB method and an LE-VGF method as well as an LEC method.

12 Claims, 3 Drawing Figures

METHOD OF PRODUCING GaAs SINGLE CRYSTALS DOPED WITH BORON

BACKGROUND OF THE INVENTION

1. FIELD OF THE INVENTION

This invention relates to a method of producing GaAs single crystal doped with boron (B) and more particularly, it is concerned with a method of growing GaAs crystal doped with boron from GaAs melt covered with $B_2O_3$ melt as a liquid encapsulant, thus lowering the dislocation density (etch pit density) in the grown crystal.

2. DESCRIPTION OF THE PRIOR ART

The important technical problem of GaAs single crystals (whose use has lately been developed as basic material for semiconductor lasers, GaAs IC or optoelectronic GaAs IC) is that it is difficult to obtain a large-sized dislocation-free crystal such as silicon (Si).

GaAs has a smaller mechanical strength at a high temperature than Si. Thus, it is considerably difficult to produce a single crystal with a cross section of 5 cm$^2$ or more and a dislocation density (EPD)$\leq$2,000 cm$^{-2}$ on a commercial scale (see Japanese Patent application OPI No. 18471/1976 and 18472/1976). A large-sized single crystal of the so-called dislocation-free (DF) class with EPD$\leq$100 cm$^{-2}$ can be obtained in only GaAs crystal doped with Si in a quantity of $1.5 \times 10^{18}$ to $5.5 \times 10^{18}$ atoms per cm$^3$ using the three-temperature-zone horizontal Bridgman (HB) method (Japanese Patent application OPI No. 62200/1977).

Since the range of its use as GaAs IC is increasing of late, a large-sized, circular low-dislocation GaAs single crystal has eagerly been demanded and it is thus required to realize a low dislocation by a technique such as a liquid encapsulated Czochralski method (LEC method), not by the prior art boat growth method (HB method, etc.).

As such a technique for realizing a low dislocation of GaAs by LEC method, in particular, the so-called "impurity hardening method" has been thought promising and is disclosed in Japanese Patent Application OPI No. 63065/1977. This describes that a low dislocation of an object single crystal can be realized by incorporating in the crystal one or more impurities selected in such a manner that the bond energy (single bond energy) between the added impurity atoms and the constitutional atoms of the object single crystal is larger than the bond energy of the object crystal in a total concentration of $1 \times 10^{-3}$ atom % or more. In the case of GaAs, $1 \times 10^{-3}$ atom % corresponds to about $4.4 \times 10^{17}$ atoms per cm$^3$. It is further described therein that the above described method is available for not only the LEC method but also other crystal growth methods such as three-temperature-zone method and HB method. Furthermore, phosphorus (P), aluminum (Al), oxygen (O) nitrogen (N), boron (B), sulfur (S) and zinc (Zn) are proposed as examples of the impurity to be added to GaAs.

SUMMARY OF THE INVENTION

It is an object of the present invention to provide a method of producing GaAs single crystals doped with boron.

It is another object of the present invention to provide a process for the growth of GaAs single crystal with a decreased dislocation density.

It is a further object of the present invention to provide a method of growing GaAs single crystal doped with boron from GaAs melt covered with $B_2O_3$ melt.

These objects can be attained by a method of producing GaAs single crystals doped with boron comprising growing GaAs crystal doped with boron from GaAs melt covered with $B_2O_3$ melt as a liquid encapsulant and thus lowering the dislocation density in the grown crystal, characterized by using a crucible made of BN, AlN or $Al_2O_3$ as a crucible for holding the GaAs melt, adding 0.25 to 0.95 atom % of boron under conditions such that the residual oxygen quantity is $5 \times 10^{-2}$ mol % or less to the GaAs melt and thereby adjusting the concentration of boron in the grown crystal to $2 \times 10^{18}$ to $1 \times 10^{19}$ atoms per cm$^3$.

BRIEF DESCRIPTION OF THE DRAWING

The accompanying drawings are to illustrate the principle and merits of the invention in more detail.

DETAILED DESCRIPTION OF THE INVENTION

The inventor has found that of various impurities proposed in the prior art, boron is particularly effective for obtaining GaAs with a low dislocation density by LEC method. Aluminum reacts with $B_2O_3$ as a liquid encapsulant to release B as follows:

$$2Al + B_2O_3 = Al_2O_3 + 2B, \qquad (1)$$

and so addition of Al is substantially equivalent to that of B. However, the $Al_2O_3$ tends to be incorporated in the grown crystal and accordingly, it is preferable to add B. The other impurities do not have such an effect or have little effect since uniform doping thereof is very difficult, or cannot give a low dislocation density without increase of micro defects such as precipitates.

Japanese Patent Application OPI No. 63065/1977 describes that a single crystal with EPD of 0–10 cm$^{-2}$ and resistivity of $10^8$ Ωcm is obtained by growing from a GaAs polycrystal melt to which 1 atom % of B and 0.36 atom % of chromium (Cr) are added by the LEC method. However, there is no disclosure as to the material of the crucible used in the LEC method and the diameter of the pulled crystal is approximately 20 mm. Up to a diameter of about 15 mm (i.e. cross-sectional area = 1.8 cm$^2$), a low dislocation GaAs can be obtained without doping by the so-called necking-in technique.

The inventor has hitherto proposed a Cr-doped semiinsulating GaAs crystal with a diameter of 50 mm and EPD$\mu 10^3$ cm$^{-2}$ at the center of wafer, which is doped with a suitable quantity of B using a quartz crucible (Japanese Patent Application OPI No. 100410/1981). However, it has been desired to improve the B-doping method using a crucible material hardly reactive with B such as PBN (e.g. pyrolytic boron nitride), AlN or $Al_2O_3$ in addition to quartz.

The added B is dissolved in the GaAs melt, reacted with oxygen (O) from the water ($H_2O$, OH) in raw materials or $B_2O_3$ and removed as $B_2O_3$ until the following reaction is equilibrated:

$$2B \text{ (in GaAs melt)} + 3O \text{ (in GaAs melt)} = B_2O_3 \text{(liquid)}. \quad (2)$$

Therefore, the doping quantity of B varies with the quantity of oxygen incorporated from raw materials and the water in the liquid encapsulant $B_2O_3$, which will hereinafter be referred to as "residual oxygen quantity". It is further found that an effective concentration of B for realizing a low dislocation of GaAs crystal with a practical size, i.e. a diameter of at least 50 mm, is within a range of about $2 \times 10^{18}$ to $1 \times 10^{19}$ atoms per $cm^3$. The above described Japanese Patent Application OPI No. 63065/1977 is silent as to the effective segregation coefficient of B, so it is not clear how much quantity of B should practically be added to the raw materials.

Figure 1:
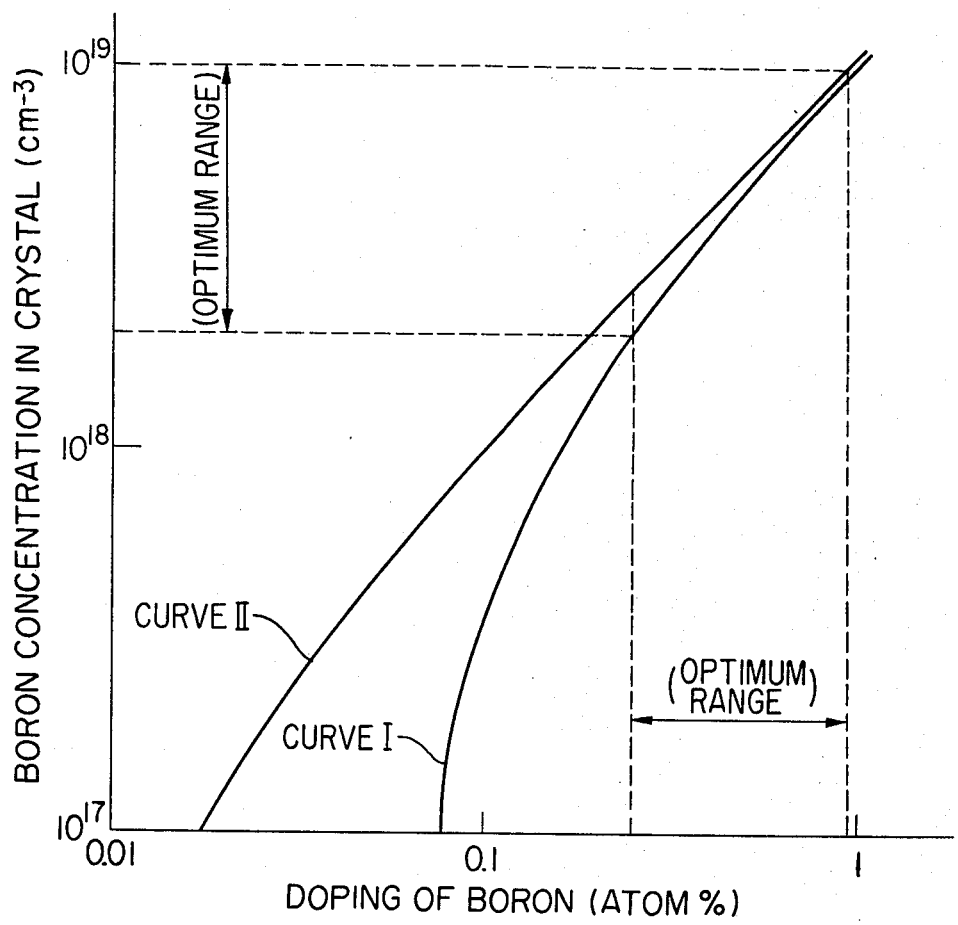
FIG. 1 is a graph showing the results of boron doping including the embodiment of the present invention.

FIG. 1 sums up results of a series of doping tests of B in an LEC method using a crucible made of PBN (Pyrolytic Boron Nitride), in which Curve I shows the concentration of B in a grown GaAs crystal where doping of B is carried out using $B_2O_3$ containing 1000 wt ppm or more of water due to insufficient removal of water. It is found that the mean residual oxygen quantity is about $5 \times 10^{-2}$ mol % to GaAs raw material and if the residual oxygen quantity is more than this, doping of B in a desired value with reproducibility is difficult. On the other hand, when doping of B is carried out using a low water content $B_2O_3$ containing about 150 to 200 wt ppm of water, the $B_2O_3$ having been subjected to a vacuum baking treatment at a high temperature for the purpose of removing water, the concentration of B in a grown GaAs crystal is as shown by Curve II. In this case, the mean residual oxygen quantity is about $6 \times 10^{-3}$ mol %. Even if the baking treatment of $B_2O_3$ is further carried out, a doping relationship substantially similar to Curve II is obtained where the concentration of B in a grown crystal is within the aimed range of $2 \times 10^{18}$ to $1 \times 10^{19}$ atoms per $cm^3$.

According to a series of doping tests as described above, it is found that in order to control the concentration of B in a crystal within a range of $2 \times 10^{18} - 1 \times 10^{19}$ atoms per $cm^3$ with good reproducibility, 0.25 to 0.95 atom % of B should be added under conditions such that the residual oxygen quantity is $5 \times 10^{-2}$ mol % or less to GaAs melt. If the quantity of added B is less than 0.2 atom %, a large effect to realize a low dislocation of GaAs crystal with a diameter of at least 50 mm is not expected, while if it is more than 1 atom %, there occurs often constitutional supercooling and the so-called striation phenomenon so that a high concentration of B is locally incorporated, resulting in a local misfit of crystal lattice being rather a cause of dislocation.

The doping relationship as shown in FIG. 1 is held similar even if a crucible made of a material other than PBN is used, the other material being a material hardly reactive with B, e.g. AlN. Similar results can also be obtained in the case of using a crucible of $Al_2O_3$ although there is some problem as to the mechanical strength.

In a GaAs crystal containing B in the optimum concentration of $2 \times 10^{18}$ to $1 \times 10^{19}$ atoms per $cm^3$, it depends on the growth conditions how the dislocation is lowered. For example, it is described in Japanese Patent Application OPI No. 63065/1977 that the temperature gradient near the solid-liquid interface in LEC method should be 100° C./cm or less, but it is not always easy to adjust the temperature gradient to 100° C./cm or less in a high pressure LEC method.

When the pressure of compressing nitrogen gas is about 20 atm, for example, a temperature gradient of 20°–80 °C./cm can be obtained only by holding the thickness of $B_2O_3$ considerably large, i.e. 2 to 5 cm before the growth. In this case, a grown crystal is protected by the thick $B_2O_3$ melt and simultaneously, release of arsenic from the surface thereof through pyrolysis is prevented. For obtaining a smaller temperature gradient the liquid encapsulated vertical Bridgman method (LE-VB method) and the liquid encapsulated vertical gradient freezing method (LE-VGF method) are effective and, not the LEC method. According to these methods, a temperature gradient of 5° to 20° C. can be realized.

In summary, the present invention provides a method of producing GaAs single crystals doped with boron comprising growing GaAs crystal doped with boron from GaAs melt covered with $B_2O_3$ melt as a liquid encapsulant and thus lowering the dislocation density in the grown crystal, characterized by using a crucible made of a material hardly reactive with boron, such as BN, AlN or $Al_2O_3$ as a crucible for holding the GaAs melt, adding 0.25 to 0.95 atom % of boron under conditions such that oxygen quantity is $5 \times 10^{-2}$ mol % or less to the GaAs melt and thereby adjusting the concentration of boron in the grown crystal to $2 \times 10^{18}$ to $1 \times 10^{19}$ atoms per $cm^3$. As additives of boron, there can be used not only elementary B but also boron compounds such as BAs, $Ga_{1-x}B_xAs$ ($0 < X < 1$), previously B-added GaAs polycrystals, and the like. The dislocation density in the grown GaAs crystal is in the range of $2 \times 10^2$ to $2 \times 10^3$ $cm^{2-}$.

In the present invention, in particular, the use of the liquid encapsulated Czochralski method (LEC method) is more effective when the thickness of $B_2O_3$ melt is chosen in the range of 2–5 cm before start of the growth and the use of the liquid encapsulated vertical Bridgman method (LE-VB method) or the liquid encapsulated vertical gradient freezing method (LE-VGF method) results in decrease of the temperature gradient at the growth boundary to a great extent and in low dislocation.

The following examples are given in order to illustrate the present invention in detail without limiting the same.

EXAMPLE 1

Figure 2:
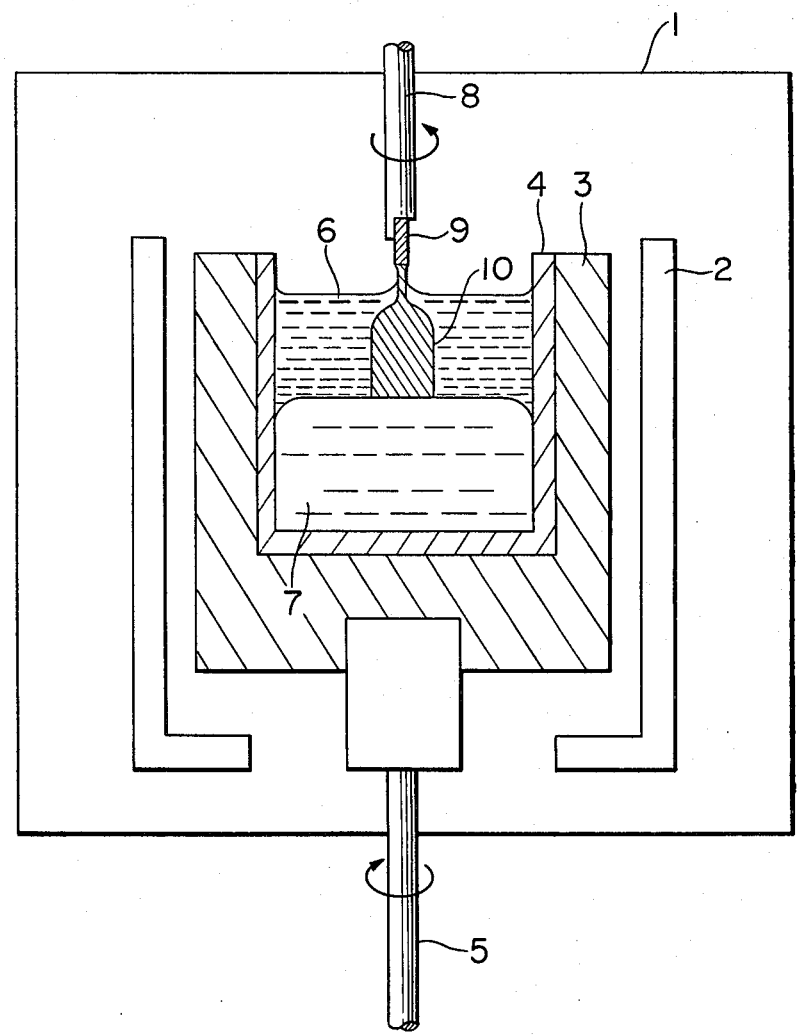
FIG. 2 is a cross-sectional view of a high pressure single crystal pulling apparatus used in one example of the present invention.

FIG. 2 is a cross-sectional view of a high pressure single crystal pulling apparatus for practicing a method of doping boron by LEC method according to the present invention.

Referring to FIG. 2, in pressure vessel 1 filled with high pressure nitrogen ($N_2$) gas of about 10 atm, carbon heater 2 is provided and carbon crucible 3 and PBN crucible 4 are mounted on lower driving shaft 5. Lower driving shaft 5 is movable vertically and rotatable to control crucibles 3 and 4 with respect to heater 2 so that an optimum temperature gradient may be obtained. About 2 kg of high purity GaAs polycrystal and 0.55 atom % of B with a purity of 99.999 % were changed in PBN crucible 4. Adequately dehydrated low water content $B_2O_3$ was used and 450 g of the $B_2O_3$ was changed therein. In this case, the thickness of $B_2O_3$ melt was about 3 cm before start of the growth. Under this condition, the temperature gradient measured was about 35° C./cm near the solid-liquid interface.

The crucible was heated at 1270° C. by carbon heater 2 to form GaAs melt 7 under $B_2O_3$ melt 6. Then, the temperature was gradually lowered to about 1250° C., while single crystal seed 9 with an orientation <100>, fitted to upper driving shaft 8, was lowered with rotation, brought into contact with GaAs melt 7 through the layer of $B_2O_3$ melt 6 and pulled at a rate of about 4-10 mm/hr with rotating at 3-15 times/min, thus obtaining GaAs single crystal 10 with a diameter of about 50 mm.

Mass spectrometry showed that the thus resulting gallium arsenide crystal contained $5-6 \times 10^{18}$ atoms per $cm^3$ of boron, $1 \times 10^{16}$ atoms per $cm^3$ or less of oxygen (less than detecting limit), $1 \times 10^{15}$ atoms per $cm^3$ or less of silicon and $5 \times 10^{14}$ atoms per $cm^3$ of chromium. The resistivity of the crystal was $2 \times 10^7 \Omega.cm$ at 300° K. and after a heat treatment at 800° C. in hydrogen gas for 30 minutes, it was $1 \times 10^7 \Omega.cm$ or more.

When (100) wafer was cut out of the substantially central part of the single crystal and subjected to examination of the dislocation density by etching using a KOH solution, the dislocation density was $2 \times 10^2$ to $5 \times 10^2$ $cm^{-2}$ at the center of the wafer and about $3 \times 10^3$ $cm^{-2}$ even at the circumference of 5 mm, thus on the average amounting to 1400 $cm^{-2}$ and the average value except 5 mm from the periphery being about $3 \times 10^2$ $cm^{-2}$.

Since the doping quantity of B is largely affected by the quantity of water in $B_2O_3$, doping should be carried out under such a condition that the residual oxygen quantity be at most $5 \times 10^{-2}$ mol %, as illustrated above referring to FIG. 1. In addition, it is, as described above, desirable to hold the optimum concentration of B to be added to a raw material at 0.25 to 0.95 atom % and the B concentration in GaAs crystal grown under this condition at about $2 \times 10^{18}$ to $1 \times 10^{19}$ atoms per $cm^3$. If the B concentration is less than $2 \times 10^{18}$ atoms per $cm^3$, not only the effect of realizing low dislocation decreased but also the B concentration is varied to a great extent with the residual oxygen quantity and the reproducibility is largely deteriorated (Cf. FIG. 1). If the concentration of B to be added to raw material GaAs exceeds about 1 atom %, there occurs constitutional supercooling and the so-called striation phenomenon that a high concentration of B is locally incorporated resulting in a local misfit of crystal lattice being rather a cause of dislocation. In an extreme case, defects such as lineage occur in GaAs crystal, leading to formation of polycrystal.

This Example is concerned with only the high resistivity GaAs doped with B alone, but it is obvious to those skilled in the art that the present invention is applicable to semi-insulating GaAs doped simultaneously with B and Cr, p-type GaAs doped simultaneously with B and Zn, and n-type GaAs doped simultaneously with B and S. If B and O are simultaneously doped, however, the effects of each are cancelled.

A suitable pressure range of a nitrogen atmosphere is 2 to 20 atm in LEC method.

EXAMPLE 2

This Example is one embodiment of the present invention according to the liquid encapsulated vertical Bridgman method (LE-VB method).

Figure 3:
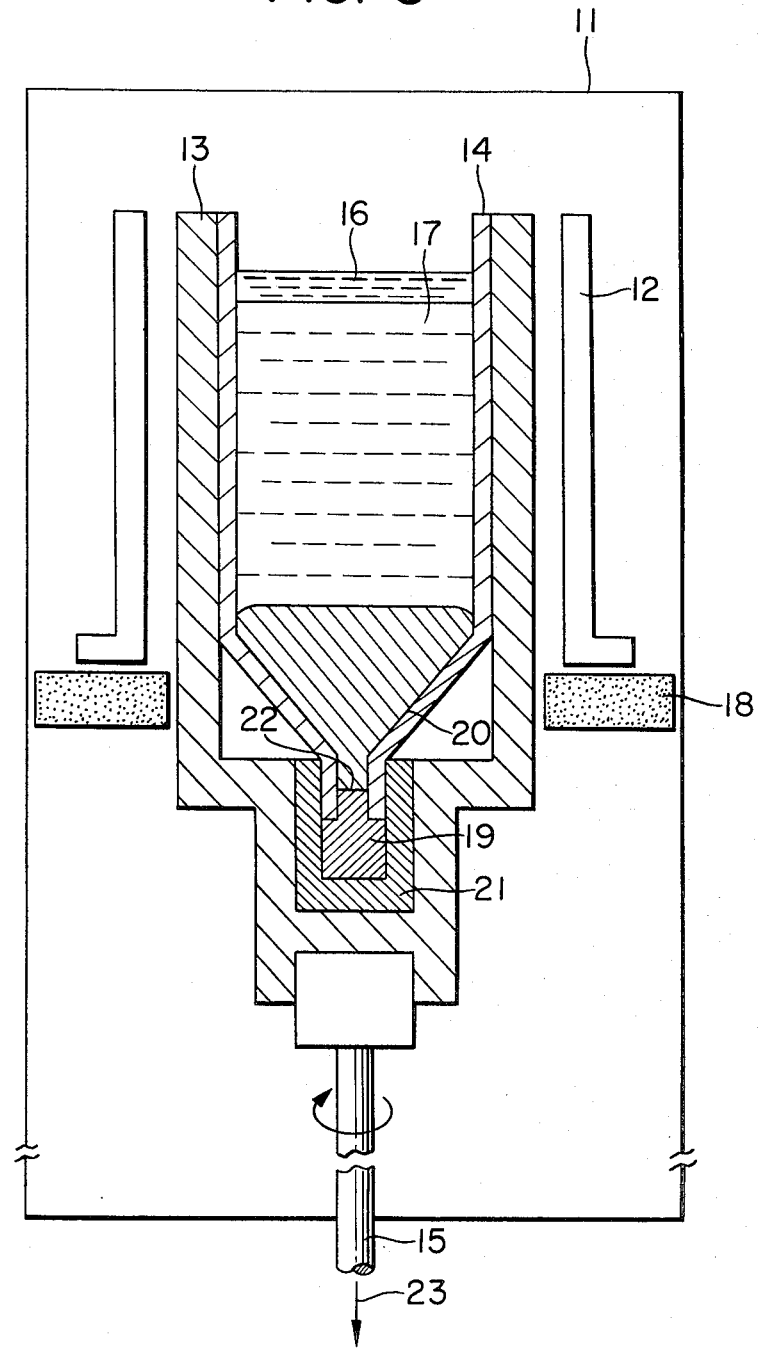
FIG. 3 is a cross-sectional view of a high pressure single crystal growing apparatus used in another example of the present invention.

FIG. 3 is a cross-sectional view of a high pressure single crystal growing apparatus for practicing LE-VB method. The apparatus of FIG. 3 is operable by two modes. One (LE-VB mode) is a method wherein the whole body of a crucible is gradually pulled down while holding a constant temperature distribution and the other (LE-VGF mode) is a method wherein the whole temperature is gradually lowered while forming a temperature gradient throughout the melt. In either method, there are basically obtained similar effects.

Referring to FIG. 3, in pressure vessel 11 filled with high pressure nitrogen gas of about 20 atm, carbon heater 12 is provided and carbon crucible 13 and PBN crucible 14 are mounted on lower driving shaft 15. The lower driving shaft is movable vertically and rotatable. About 2 kg of high purity GaAs polycrystal and 0.35 atom % of B with a purity of 99.999 % were charged in PBN crucible 14. Low water content $B_2O_3$ was used and about 35 g of the $B_2O_3$ was changed therein. The thickness of $B_2O_3$ 16 was about 1 cm under melted state. Under this condition, the temperature gradient measured in GaAs melt 17 was 5°-20° C./cm near insulator 18. The temperature gradient could be controlled by the positional relationship of crucible 14 to heater 12 or by the heater temperature. GaAs single crystal was grown by the vertical Bridgman method comprising melting the raw material in such a manner that upper surface 22 of GaAs single crystal seed 19 with crystallographic orientation <111> B (i.e. <111> As) set by BN seed holder 21 was not melted, controlling the position of crucible 14 to melt the upper surface of seed 19 and pulling down the whole crucible at a rate of about 4 mm/hour in the direction of arrow 23. In this figure, GaAs crystal 20 was grown upward according to PBN crucible 14.

Mass spectrometry showed that the resulting gallium arsenide crystal contained $2.5-4 \times 10^{18}$ atoms per $cm^3$ of boron, $8 \times 10^{14}$ atoms per $cm^3$ of chromium and $\leq 1 \times 10^{15}$ atoms per $cm^3$ of silicon. The quantity of oxygen was less than detecting limit. Similarly to Example 1, chromium and silicon were unintensional impurities. The resistivity at 300° K. was $3 \times 10^7$ $\Omega.cm$ and even after a heat treatment at 800° C. in hydrogen gas for 30 minutes, it was $1 \times 10^7$ $\Omega.cm$ or more.

When (111) wafer was cut out of the central part of the single crystal as in Example 1 and subjected to examination of the dislocation density by etching using an $H_2SO_4/H_2O_2/H_2O$ solution, the dislocation was substantially uniformly distributed in the wafer with a measured value of $2 \times 10^2$ to $1 \times 10^3$ $cm^{-2}$.

A suitable pressure range of a nitrogen atmosphere is 2 to 60 atm B in the LE-VB method or the LE-VGF method. When an undoped GaAs crystal with a diameter of 50 mm is grown using $B_2O_3$ melt with an ordinary thickness, i.e. 10–15 mm in nitrogen gas at about 10 to 20 atm by the LEC method, the mean dislocation density is $2 \times 10^4$ to $1 \times 10^5$ $cm^{-2}$ and the temperature gradient near the solid-liquid interface is 90° 120° C./cm. The dislocation density lowers sometimes to $5 \times 10^3 - 1 \times 10^4$ $cm^{-2}$ at the front portion of the single crystal and the central portion of the wafer, but amounts to about $1 \times 10^5$ $cm^{-2}$ in the peripheral region of the wafer.

The method of the present invention is not intended to be limited to the scope of the foregoing Examples.

For example, this method can be applied to another LEC method wherein GaAs melt is directly synthesized from elemental Ga and As as disclosed by AuCoin et al., "Liquid Encapsulated Compounding and Czochralski Growth of Semi-Insulating Gallium Arsenide", *Solid State Technology*, January, 1979, pages 59-62. This method is called the in-situ compounding LEC method or the direct synthesis LEC method. Therefore, this invention can be applied to the direct synthesis LEC method comprising subjecting raw materials gallium and arsenic with boron to direct synthesis of GaAs melt at a nitrogen gas pressure of 60 atm or more and lowering the pressure of nitrogen gas to a desired value of 5-30 atm and then growing GaAs crystal doped with boron. Moreover, if the bottom of the PBN crucible is made porous and arsenic is fed into melt 7 from another chamber holding arsenic, as shown in Akai et al., U.S. Pat. No. 3,902,860, GaAs doped with B can be grown with controlling the vapor pressure of arsenic.

As apparant from the foregoing detailed description, the present invention provides a method of producing GaAs crystals having a large size, e.g. at least a diameter of 50 mm and fewer crystalline defects, e.g. dislocation and precipitates, and doped with boron in an optimum concentration, whereby it is made possible to produce an inexpensive and high quality single crystal substrate for semiconductor lasers, GaAs IC or new type GaAs IC for optoelectronics (OE) requiring a large-sized, circular low dislocation GaAs single crystal.

What is claimed is:

1. In a method of producing GaAs single crystals doped with boron and having a lowered dislocation density from a GaAs melt covered with $B_2O_3$ melt as a liquid encapsulant, the improvement comprising:
   using a crucible made of a material selected from the group consisting of PBN, AlN and $Al_2O_3$ as a crucible for holding the GaAs melt, adding 0.25 to 0.95 atomic percent of boron to said GaAs melt under conditions such that the residual oxygen quantity is at most $5 \times 10^{-2}$ mole percent to said GaAs melt, thereby adjusting the concentration of boron in the grown crystal to $2 \times 10^{18}$ to $1 \times 10^{19}$ atoms per $cm^3$.

2. The method as claimed in claim 1 wherein the single crystals are grown by employing an LEC method while adjusting the thickness of the $B_2O_3$ melt to 2 to 5 cm before the start of the crystal growth.

3. The method as claimed in claim 2, including employing a nitrogen atmosphere over the $B_2O_3$ melt and adjusting the nitrogen atmosphere to a pressure of 2 to 20 atm.

4. The method as claimed in claim 1 wherein the single crystals are grown by employing a LE-VB method.

5. The method as claimed in claim 4, including employing a nitrogen atmosphere over the $B_2O_3$ melt and adjusting the nitrogen atmosphere to a pressure of 2 to 60 atm.

6. The method as claimed in claim 1 wherein the boron is added in the form of at least one member selected from the group consisting of elementary B, BAs, $Ga_{1-x}B_xAs$ ($0 < x < 1$), and B-doped GaAs polycrystal.

7. The method as claimed in claim 1 wherein an element selected from the group consisting of Cr, Zn and S is added simultaneously with boron.

8. The method as claimed in claim 1 wherein the $B_2O_3$ melt has a water content of 150-200 wt ppm.

9. The method as claimed in claim 1 wherein the GaAs melt is directly synthesized from Ga, As, and B in a nitrogen atmosphere at a pressure of at least 60 atm.

10. The method as claimed in claim 1 wherein the dislocation density of the GaAs single crystal doped with boron is 200 to 300 per $cm^2$.

11. The method as claimed in claim 1, wherein the single crystals are grown by employing an LE-VGF method.

12. The method as claimed in claim 1, wherein the single crystals are grown by employing an LEC method and a crucible having a porous bottom while controlling the vapor pressure of arsenic being fed into the GaAs melt through the porous bottom of the crucible from another chamber containing arsenic.

* * * * *